(12) United States Patent
Chudzik et al.

(10) Patent No.: US 8,728,925 B2
(45) Date of Patent: May 20, 2014

(54) METHOD AND STRUCTURE FOR WORK FUNCTION ENGINEERING IN TRANSISTORS INCLUDING A HIGH DIELECTRIC CONSTANT GATE INSULATOR AND METAL GATE (HKMG)

(75) Inventors: Michael P. Chudzik, Danbury, CT (US); William K. Henson, Beacon, NY (US); Unoh Kwon, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 14 days.

(21) Appl. No.: 13/463,283

(22) Filed: May 3, 2012

(65) Prior Publication Data

US 2012/0214299 A1 Aug. 23, 2012

Related U.S. Application Data

(62) Division of application No. 12/757,323, filed on Apr. 9, 2010, now Pat. No. 8,350,341.

(51) Int. Cl.
*H01L 21/3205* (2006.01)
*H01L 21/4763* (2006.01)

(52) U.S. Cl.
USPC ............. 438/591; 257/E21.625; 257/E21.639

(58) Field of Classification Search
None
See application file for complete search history.

(56) References Cited

U.S. PATENT DOCUMENTS

| | | | |
|---|---|---|---|
| 6,844,604 B2 | 1/2005 | Lee et al. | |
| 7,105,889 B2 | 9/2006 | Bojarczuk, Jr. et al. | |
| 7,112,539 B2 | 9/2006 | Lee et al. | |
| 7,374,998 B2 | 5/2008 | Hergenrother et al. | |
| 2007/0059872 A1 | 3/2007 | Visokay et al. | |
| 2007/0152276 A1 | 7/2007 | Arnold et al. | |
| 2007/0212896 A1 | 9/2007 | Olsen et al. | |

(Continued)

FOREIGN PATENT DOCUMENTS

WO 2009/133515 11/2009

OTHER PUBLICATIONS

S. Kim et al., "Atomic Layer Deposited HfO2/HfSixOyNz Stacked Gate Dielectrics for Metal-Oxide-Semiconductor Structures", Journal of Vacuum Science Technology B (Microelectronics and Nanometer Structures), Nov. 2007, vol. 25, No. 6, pp. 1922-1927, Published for the American Vacuum Society by the American Institute of Physics, USA.

(Continued)

*Primary Examiner* — Daniel Whalen
(74) *Attorney, Agent, or Firm* — Whitham, Curtis, Christofferson & Cook, P.C.; Joseph P. Abate

(57) ABSTRACT

Adjustment of a switching threshold of a field effect transistor including a gate structure including a Hi-K gate dielectric and a metal gate is achieved and switching thresholds coordinated between NFETs and PFETs by providing fixed charge materials in a thin interfacial layer adjacent to the conduction channel of the transistor that is provided for adhesion of the Hi-K material, preferably hafnium oxide or HfSiON, depending on design, to semiconductor material rather than diffusing fixed charge material into the Hi-K material after it has been applied. The greater proximity of the fixed charge material to the conduction channel of the transistor increases the effectiveness of fixed charge material to adjust the threshold due to the work function of the metal gate, particularly where the same metal or alloy is used for both NFETs and PFETs in an integrated circuit; preventing the thresholds from being properly coordinated.

6 Claims, 3 Drawing Sheets

(56) References Cited

U.S. PATENT DOCUMENTS

| | | | |
|---|---|---|---|
| 2008/0185631 A1* | 8/2008 | Lee et al. | 257/316 |
| 2008/0188044 A1 | 8/2008 | Hsu et al. | |
| 2008/0191292 A1 | 8/2008 | Callegari et al. | |
| 2008/0245658 A1 | 10/2008 | Callegari et al. | |
| 2008/0293259 A1 | 11/2008 | Andreoni et al. | |
| 2009/0011610 A1 | 1/2009 | Bojarczuk, Jr. et al. | |
| 2009/0032910 A1 | 2/2009 | Ahn et al. | |
| 2009/0152637 A1 | 6/2009 | Carter et al. | |
| 2009/0212369 A1 | 8/2009 | Park et al. | |
| 2009/0236676 A1 | 9/2009 | Zhu et al. | |
| 2010/0038725 A1 | 2/2010 | Chudzik et al. | |

OTHER PUBLICATIONS

Disclosed Anonymously, "Method for Reduction of Random Dopant Induced, Threshold Voltage Variation", www.IP.com, IPCOM000042241D, Feb. 3, 2005.

Kaushik et al., "Estimation of Fixed Charge Densities in Hafnium-Silicate Gate Dielectrics", IEEE Transactions on Electron Devices, vol. 53, No. 10, Oct. 2006, pp. 2627-2633.

Akbar et al., "Electrical Performance and Reliability Improvement by Using Compositionally Varying Bi-Layer Structure of PVD HfSixOy Dielectric", IEEE Electron Device Letters, vol. 36, No. 3, Mar. 2005, pp. 166-168.

Rittersma et al., "Characterization of Mixed-Signal Properties of MOSFETs With High-k (SiON/HfSiON/TaN) Gate Stacks", IEEE Transactions of Electron Devices, vol. 53, No. 5, May 2006, pp. 12161225.

PCT/US2011/031185—International Search Report mailed Jun. 22, 2011.

PCT/US2011/031185—Written Opinion of the International Searching Authority mailed Jun. 22, 2011.

Hoentschel; Eurosoi Tutorial Advanced SOI Technologies; Devices and Product Integration, Globalfoundries Fab 1, Jan. 25, 2010; pp. 1-75.

Kawanago; "A Study on High-k Gage Stack Engineering for Improving Mobility"; Master Thesis, Tokyo Institute of Technology, Dec. 2008; pp. 1-98.

* cited by examiner

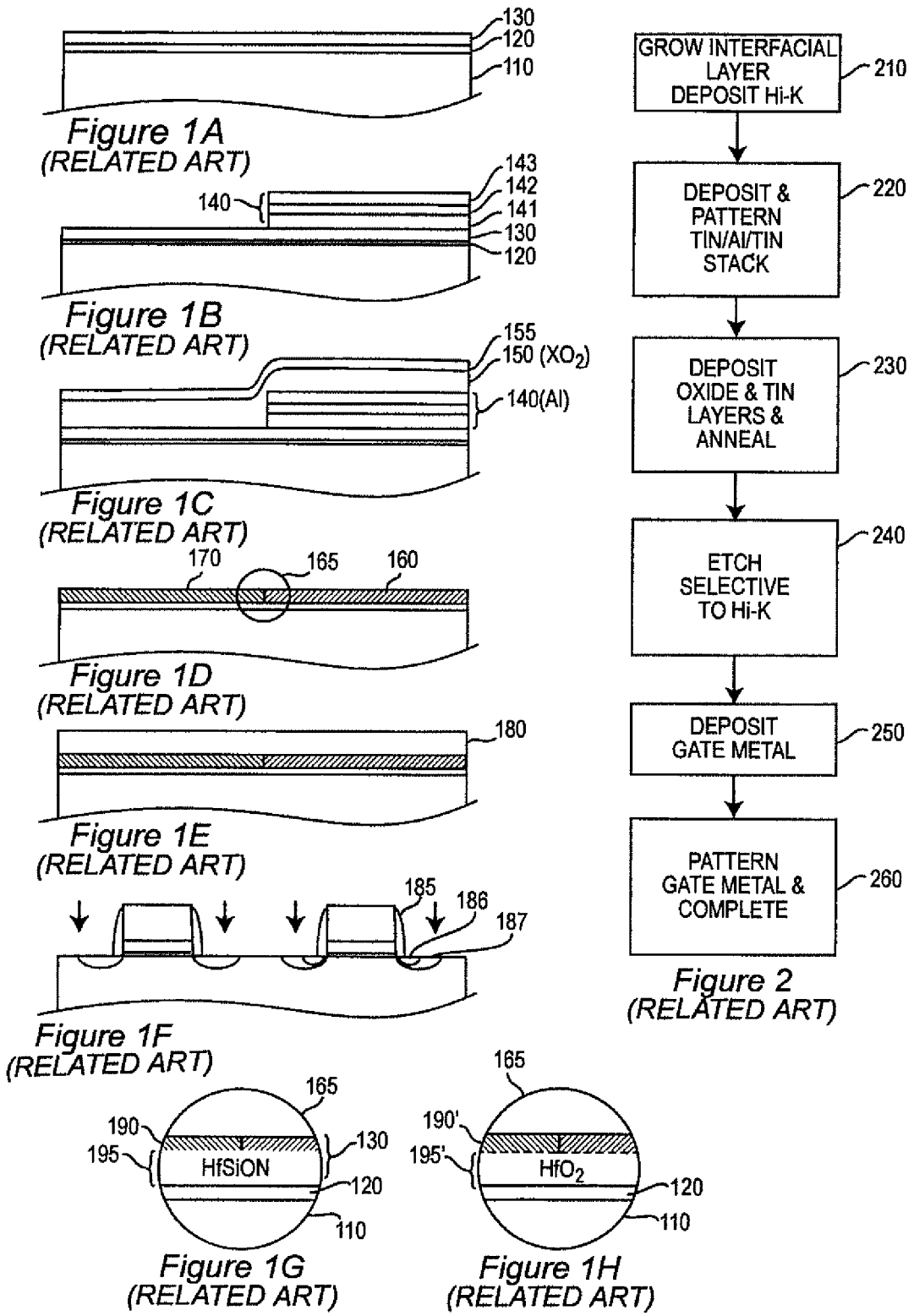

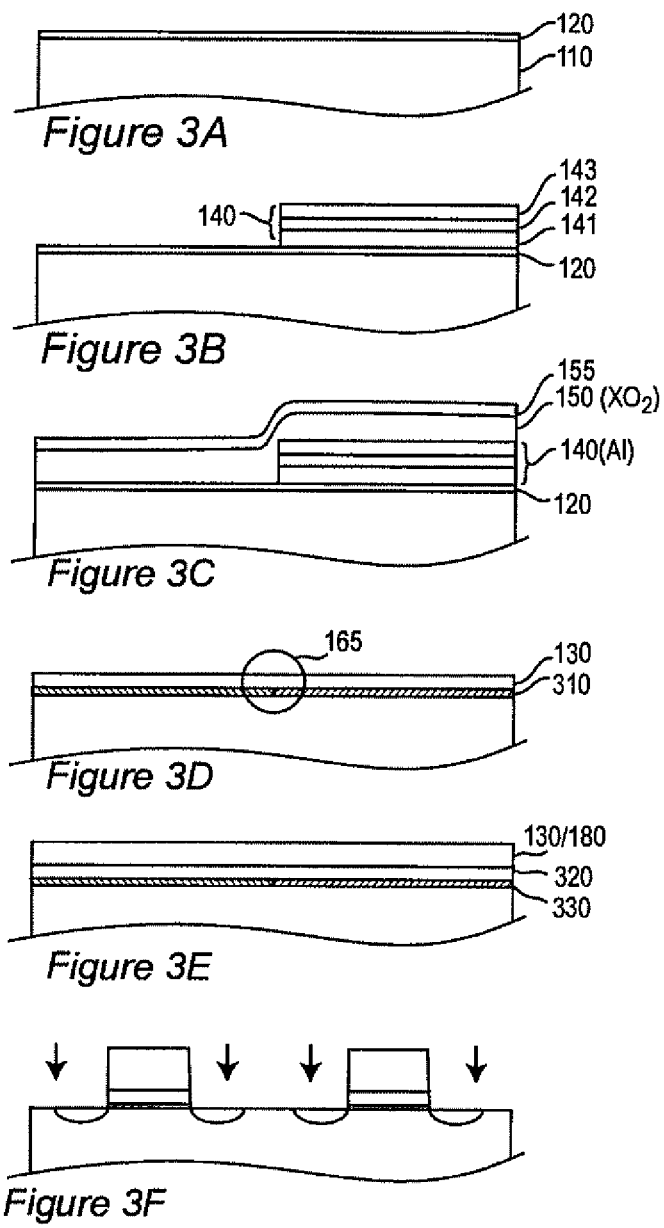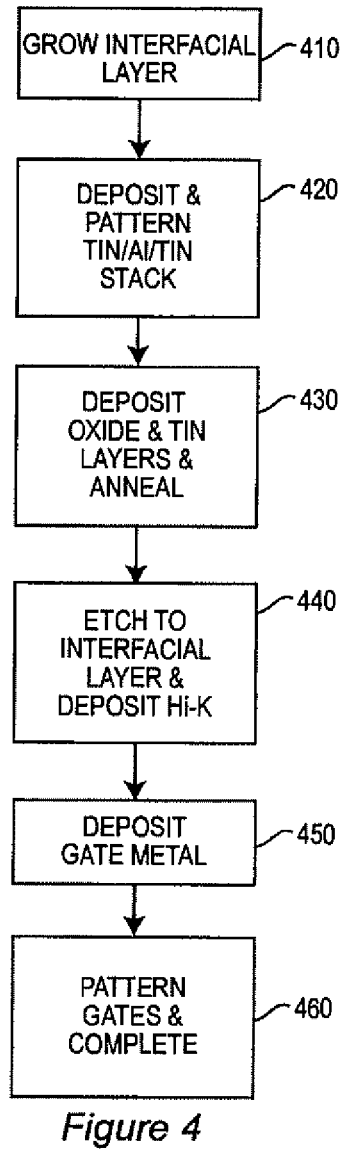

METHOD AND STRUCTURE FOR WORK FUNCTION ENGINEERING IN TRANSISTORS INCLUDING A HIGH DIELECTRIC CONSTANT GATE INSULATOR AND METAL GATE (HKMG)

CROSS-REFERENCE TO RELATED APPLICATIONS

This application is a division of U.S. patent application Ser. No. 12/757,323, filed Apr. 9, 2010, which issued as U.S. Pat. No. 8,350,341 on Jan. 8, 2013, and which is incorporated herein by reference.

FIELD OF THE INVENTION

The present invention generally relates to high performance field effect transistors suitable for semiconductor integrated circuits and, more particularly, to transistors having gate structures including a high dielectric constant gate insulator and a metal gate, sometimes referred to as HKMG transistors.

BACKGROUND OF THE INVENTION

The desire for increased functionality and performance of semiconductor integrated circuits and increased economy of manufacture has driven designs for such integrated circuits to extreme levels of integration density and reduction of size of electronic elements therein such as transistors. Complementary pairs of field effect transistors (FETs) of opposite conductivity types, referred to as NFETs and PFETs, have become the transistor technology of choice and ubiquitous in all but the most critical integrated circuit applications.

Since performance of a given transistor design may be compromised when the design is scaled to smaller sizes, many sophisticated transistor design features have been developed in order to preserve and enhance transistor performance of extremely small transistors. One such design feature applicable to field effect transistors is a gate structure using a high dielectric constant material (having a dielectric constant greater than eight but often greater than twenty) for the gate insulator and highly conductive metal for the gate electrode. Such a structure is often referred to by the abbreviation/acronym "HKMG". Using such materials, the gate insulator can be made very thin and a highly conductive metal gate electrode can rapidly distribute electrical charge across the full surface of the gate adjacent the gate insulator; developing a much more nearly uniform electrical field for controlling current in the conduction channel of the transistor and improving the on/off resistance ratio which increases noise immunity and is particularly critical for low power operation required by power dissipation limitations incurred at high integration densities.

However, the metal chosen for the gate electrode has a profound effect on the work function of the gate and thus on the switching threshold of the FET. Since the same gate material must generally be used for both NFETS and PFETS transistors (to avoid severely complicating the manufacturing process and severely compromising manufacturing yield) and the switching thresholds of the respective NFETS and PFETS transistors of a complementary pair must be coordinated to avoid excessive currents in the series connected pair but has opposite effects on NFETs and PFETs and increases the magnitude of the switching threshold, the metal chosen for the gates cannot be ideal for either conductivity type. Therefore, it has been necessary to diffuse different materials into the high dielectric constant (Hi-K) material to adjust the work functions in opposite directions for the respective NFETS and PFETS by incorporating fixed charge materials into the Hi-K material. However, such processing is not entirely effective to achieve the desired switching thresholds for the NFETS and PFETS since the alteration in work function available therefrom is relatively small using materials which are capable of producing a stable shift of switching threshold when diffused into the Hi-K material and providing fixed charge materials at the interface of the metal gate and Hi-K material as has been thought necessary. Accordingly, the full performance potential of HKMG gate structures in FET designs has not been fully realized.

SUMMARY OF THE INVENTION

It is therefore an object of the present invention to provide a HKMG structure and manufacturing methodology which allows greater work function shifts to be obtained which are stable and thus enable greater engineering latitude to obtain more nearly ideal switching thresholds in complementary NFETS and PFETS transistors.

In order to accomplish these and other objects of the invention, a transistor, pair of complementary transistors and/or an integrated circuit is provided in which a transistor comprises a conduction channel region, an interfacial layer having fixed charge material disposed therein, a gate insulator comprising Hi-K material, and a metal gate adjacent said gate insulator.

In accordance with another aspect of the invention, a method of manufacture of a semiconductor device is provided comprising steps of forming an interfacial layer containing a fixed charge material on a layer or substrate of semiconductor material, forming a gate structure including a Hi-K dielectric and a gate comprising metal or an alloy on the interfacial layer, and completing the semiconductor device.

BRIEF DESCRIPTION OF THE DRAWINGS

The foregoing and other objects, aspects and advantages will be better understood from the following detailed description of a preferred embodiment of the invention with reference to the drawings, in which:

FIGS. 1A, 1B, 1C, 1D, 1E and 1F are cross-sectional views of a portion of the manufacturing process of a HKMG transistor useful in understanding the invention the problems addressed by the invention, FIGS. 1G and 1H are, respectively, a detail of FIG. 1D for different Hi-K materials, FIG. 2 is a depiction of the process flow corresponding to FIGS. 1A-1F, FIGS. 3A, 3B, 3C, 3D, 3E, and 3F are cross-sectional views of a portion of the manufacturing process of a HKMG transistor in accordance with the invention, FIG. 3G is a detail of FIG. 3D, FIG. 4 is a depiction of a process flow corresponding to FIGS. 3A-3F.

DETAILED DESCRIPTION OF A PREFERRED EMBODIMENT OF THE INVENTION

Figure 5:
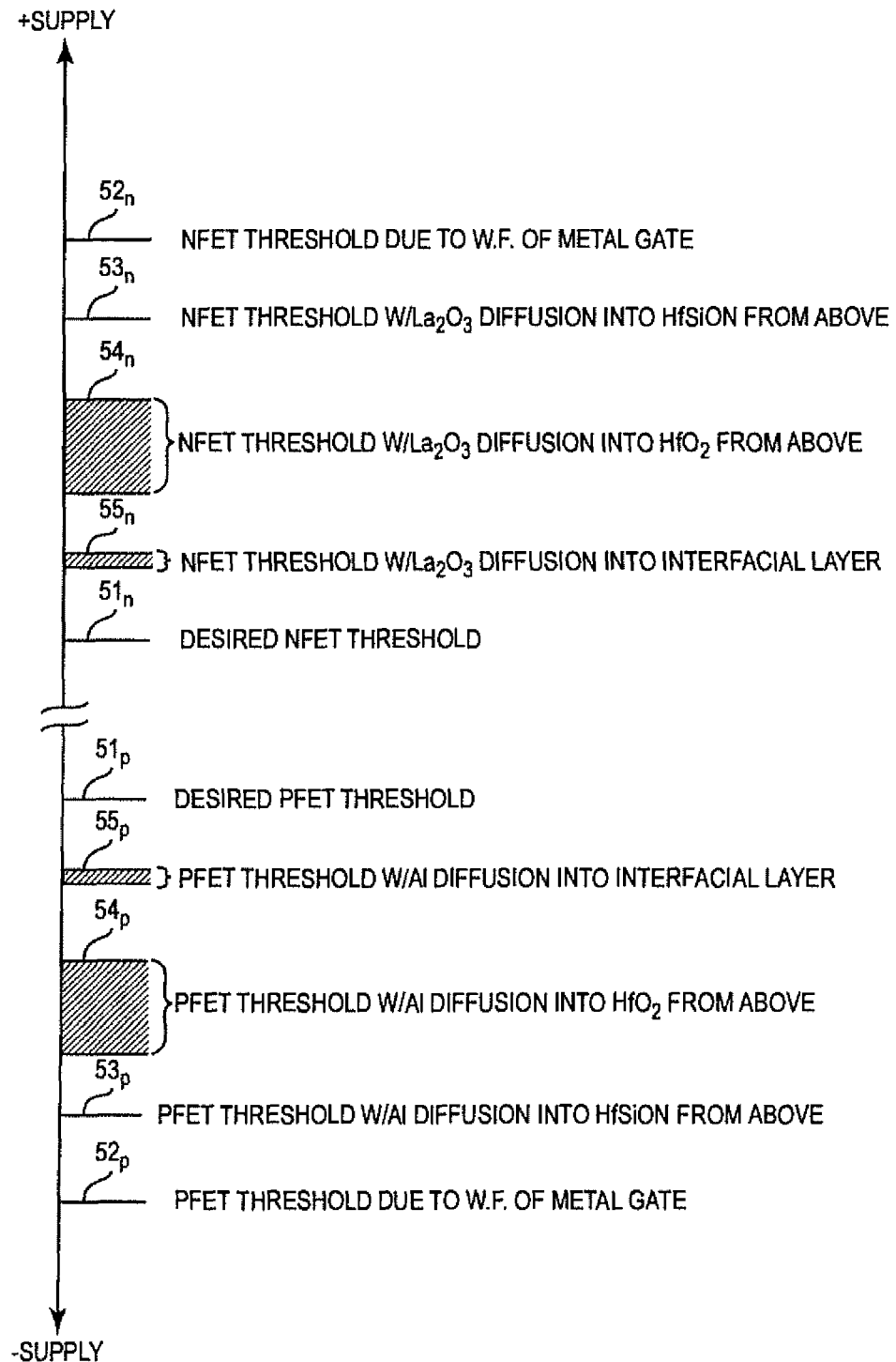
FIG. 5 illustrates a qualitative comparison of threshold voltages of NFETs and PFETs of different designs but fabricated in accordance with the process of FIGS. 1A-1F and FIG. 2 using either HfSiON or $HfO_2$, respectively, with threshold voltages obtainable in accordance with the invention.

Referring now to the drawings, and more particularly to FIGS. 1A-1H and FIG. 2, there are shown cross-sectional views and a process flow of stages in the formation of a HKMG transistor prior to the present invention. It should be understood that FIGS. 1A-1H can be employed with different materials, including the demonstrably advantageous material which the invention successfully incorporates into a HKMG transistor, and are arranged to facilitate conveyance of an understanding of the invention and the problems addressed thereby. Accordingly, while FIGS. 1A-1H and FIG. 2 do not depict the preferred embodiment of the invention, no portion of any of FIGS. 1A-1H or FIG. 2 is admitted to be prior art in regard to the invention. Therefore, these Figures have been labeled as "Related Art".

FIG. 1A illustrates an initial stage in the fabrication of a HKMG transistor in which an interfacial layer 120 has been formed on substrate or other body or layer of semiconductor material 110 (e.g. silicon but other semiconductor materials can be used). Preferably, the interfacial layer 120 is grown by thermal oxidation or nitridation to a very small thickness since it functions principally for purposes of adhesion of a Hi-K dielectric in the context of FIGS. 1A-1G. Therefore, additional thickness serves no beneficial purpose and can compromise the meritorious effects of the Hi-K dielectric since additional thickness would increase separation of both the Hi-K dielectric and the gate electrode from the conduction channel of the transistor that will be formed in substrate or layer 110. Hi-K dielectric layer 130 having a thickness in the range of 0.8 nm to 4.0 nm but preferably about 2.0 nm is then deposited over the interfacial layer 120 as indicated at step 210 of FIG. 2, In the context of FIGS. 1A-1H, adjustment of the work function and switching threshold voltage Vt is achieved by diffusing materials into the Hi-K material which, when incorporated therein, function as embedded charges (e.g. excess electrons or holes) which provide a persistent component of an electric field which can be reduced or augmented by a voltage externally applied thereto from, for example, the gate electrode. Thus, the adjustment of work function by embedding fixed charge materials into the Hi-K material in an FET gate can alter the threshold voltage of the FET.

In general, a given integrated circuit design will include transistors having many different threshold voltages, depending on the types of circuits (e.g. logic, inverters, level shifters and the like) the operational conditions thereof. In integrated circuits using complementary pairs of FETs it is also generally desirable to coordinate the switching thresholds of the respective transistors of a complementary pair such that, during switching, one of the transistors is turned off (or substantially so) before the other transistor becomes significantly conductive in order to prevent the pair from forming a conductive path across the power supply voltage. Therefore, for a given complementary pair of transistors, it is generally desirable for the threshold of the NFET device to be comparatively higher than the threshold for the PFET device and of magnitudes which are symmetrical about a given desired voltage as shown at 51$n$, 51$p$ of FIG. 5. However, it is also generally desirable for the magnitudes of the thresholds be relatively small since a larger magnitude threshold may increase the difficulty of achieving desired switching and, if sufficiently great, can prevent switching altogether. As alluded to above, since it is preferred to form metal gates from the same material in both NFETs and PFETs, the metal is chosen to provide respective work functions approximately mid-way between the desired work functions of the NFETs and the PFETs to minimize increase of the magnitude of the shift or increase in switching thresholds, as shown at 52$n$, 52$p$ of FIG. 5 and to diffuse different fixed charge materials into the Hi-K materials of the NFETs and PFETs, respectively, chosen to have opposite effects on the work functions and corresponding thresholds of the respective transistor types as shown at 53$n$, 53$p$ of FIG. 5. That is, the fixed charge materials counteract a portion of the threshold shift that is caused by the work function (W.F.) of the metal gate. In general, aluminum is preferred as the fixed charge material for PFETs and rare earth metals such as lanthanum are preferred fixed charge materials for NFETs. (In FIG. 1A-1H, the left side of each Figure will become an NFET and the right side will become a PFET.)

Accordingly, as shown in FIG. 1B, a sequence of layers forming an aluminum-containing stack 140 is applied and patterned to remove the stack from areas where NFETs are to be formed as illustrated at step 220 of FIG. 2. This stack is preferably composed of TiN layer 141, aluminum layer 142 and another TiN layer 143. Aluminum is able to diffuse through TiN although TiN will serve as a diffusion barrier for many other materials such as oxygen or rare earth metallic oxides. In other words, TiN layer 143 serves to protect aluminum layer 142 from contamination from external sources and TiN layer 141 functions in the nature of a filter for the aluminum when aluminum is diffused into the Hi-K material.

Referring now to FIG. 1C, a layer of rare earth metal oxide 150 is applied. Many rare earth metal oxides and/or nitrides can be used. The rare earth metal containing layer 150 comprises an oxide or nitride of at least one element from Group IIIB of the Periodic Table of Elements including, for example, La, Ce, Pr, Nd, Sm, Eu, Ga, Th, Dy, Ho, Er, Tm, Yb, Lu or mixtures thereof. Preferably the rare earth metal containing layer comprises an oxide of La, Ce, Y, Sm, Er, and/or Th with $La_2O_3$ on LaN being most preferred. This layer can extend over the entire chip including layered stack 140 since the (hereinafter exemplary) lanthanum oxide cannot diffuse through the TiN layers 143, 141 in stack 140. Rare earth metal oxide layer 150 is then covered by a layer 155 of TiN and an optional silicon (or other semiconductor material) cap to prevent out-diffusion of oxygen during the thermal annealing process which is then used to drive aluminum and lanthanum oxide into respective areas 160, 170 of the Hi-K material as shown at step 230 of FIG. 2.

This structure (e.g. layers 141-143, 150 and 155) is then preferably stripped by selective etching to the Hi-K material having aluminum and lanthanum oxide diffused into respective areas thereof. The diffused aluminum and lanthanum oxide are not removed by this process but only the stack 140 and layers 150 and 155 which have served as diffusion sources, as shown at FIG. 1D and step 240 of FIG. 2. These diffusion sources could be left in place but different thicknesses of gate metal would result; making patterning difficult and complicating the overall process. Therefore removal of these structures by simple selective etching is much preferred.

Then, as shown in FIGS. 1E and 1F the HKMG structure is completed by depositing the desired gate metal layer 180 and patterning it by etching to the substrate or layer 110 as shown at steps 250 and 260 of FIG. 2. Removal of the interfacial oxide between the individual gate structures so formed is optional but preferred. The transistor is then completed by forming sidewall spacers 185, performing desired implants 186, forming silicide contacts 187, if desired, and the like and making connections to the gate, source and drain regions.

Referring now to FIG. 1G which is an enlarged view of region 165 of FIG. 1D, it should be noted that, in accordance with the process discussed above, diffusion of aluminum and lanthanum oxide into Hi-K layer 130 is from above (in the orientation shown) and the extent of diffusion is severely limited and widely separated from the interfacial layer and substrate/channel region due to the density of hafnium silicate (HfSiON) which is widely used for the Hi-K material. Although diffusion is limited by such a material during annealing, the distribution of diffused aluminum and lanthanum oxide is quite stable thereafter. However, the limitation of diffusion and the separation of diffusion region 190 from the interfacial layer and substrate also severely limit the degree to which the work function and corresponding threshold voltage of the transistor can be altered if HfSiON is used as the Hi-K material due to the difficulty of diffusing materials into HfSiON. Thus, as shown at 53n, 53p in FIG. 5, using any given metal or alloy for both the NFET and PFET gates, the work function and corresponding thresholds cannot be adjusted or properly coordinated between NFET and PFET transistors for high performance at optimally low noise susceptibility using HfSiON as the Hi-K material.

An alternative Hi-K material is hafnium oxide ($HfO_2$) in which a greater degree of diffusion can be more easily achieved. If the process described above in connection with FIGS. 1A-1F is carried out using $HfO_2$ as the Hi-K material, the resulting diffusion in region 165 of FIG. 1D will more closely resemble that depicted in FIG. 1H in which a greater depth 190' of both aluminum and LaO is evident. This greater depth brings the diffusion regions closer to the interfacial layer 120 and channel region 110 (e.g. region 195' of FIG. 1H is significantly smaller than region 195 of FIG. 1G) where a greater effect on work function adjustment and corresponding transistor switching threshold will result, as shown at 54n, 54p of FIG. 5. Therefore, hafnium oxide ($HfO_2$) can potentially provide a much increased degree of flexibility in designing and obtaining desired work function and threshold shift in HKMG transistors and is demonstrably superior to hafnium silicate (HfSiON) in that regard as may be seen in FIG. 5 where lower thresholds are obtained.

However, while lower thresholds are obtained using $HfO_2$ as the Hi-K material as shown in FIG. 5, they remain marginal and little, if any, improvement is achieved in coordinating thresholds of NFETs and PFETs. Perhaps more importantly, the very property of permitting a greater degree of diffusion of aluminum and lanthanum oxide exhibited by hafnium oxide also makes hafnium oxide much less than fully acceptable as a Hi-K material. That is, the greater diffusivity of materials in hafnium oxide makes the diffusion of aluminum and lanthanum oxide in the hafnium oxide unstable; allowing incursion of lanthanum oxide into region 195' of FIG. 1H, as schematically shown. This instability is manifested in a relatively wide range of potential shift in threshold voltage as depicted in the hatched width of thresholds 54n, 54p in FIG. 5. Since excess oxygen in Hi-K materials also emulates implanted charge, the effect on work function and transistor switching threshold varies with distance from the interfacial layer 120 and channel region 110. Since the Hi-K gate insulator is very thin, only a small change in separation due to instability of the lanthanum oxide diffusion can cause a substantial change in switching threshold voltage. Additionally, this effect is aggravated by the possibility of additional oxygen diffusing into the hafnium oxide from the edges of the gate region (e.g. from oxide sidewall spacers 185) and thus can cause variability in the effects of diffused rare earth fixed charge materials. Therefore, the threshold voltage in NFETs transistors using hafnium oxide as the Hi-K material and fabricated in accordance with the process of FIGS. 1A-1F is not only not well-controlled but is subject to variation after the integrated circuit is placed in service and cannot be coordinated with the switching threshold voltage of the PFET transistors, as must be achieved for proper operation and reduced susceptibility to noise, avoidance of excess power consumption and other switching function anomalies in complementary transistor pairs.

This variability in threshold voltage is seen in FIG. 5 in the greater range of threshold voltages 54n, 54p obtained using $HfO_2$ as the Hi-K material. Although not depicted in FIG. 5 in the interest of clarity, it is also significant and should be noted that the range of variability using $HfO_2$ can be sufficiently large to actually overlap the threshold voltages obtained using HfSiON and thus an improvement thereover, while strongly favored statistically, is not guaranteed simply by the substitution of $HfO_2$ for HfSiON in the manufacturing process illustrated in FIGS. 1A-1F, particularly since the fixed charge materials remain widely separated from the interfacial layer and the channel region.

Referring now to FIGS. 3A-3G and FIG. 4, the manufacturing process and transistor structure in accordance with the invention will be discussed. It may be helpful in conveying an understanding of the invention to compare FIGS. 1A-1F with FIGS. 3A-3F and FIG. 2 with FIG. 4 and to observes that the principal difference is the point at which the Hi-K material is deposited. To facilitate this comparison, identical reference numerals have been used to identify corresponding elements appearing in both sets of FIGS. 1A-1F and 3A-3F. The later deposition of Hi-K material in FIGS. 3A-3F is completely counter-intuitive from the reliance on diffusion of work function altering fixed charge material into the Hi-K material in the process of FIGS. 1A-1F since it has been assumed, prior to the invention, that fixed charge or dipoles at the interface of the metal and Hi-K materials were necessary to achieve an alteration of work function due to the metal of the gate electrodes. In other words, the invention as illustrated in FIGS. 3A-3G and FIG. 4 diffuses the fixed charge materials into the interfacial layer 120 (where it is confined immediately adjacent to the channel region 110 and where it will have greatest effect) and then, potentially, into the Hi-K material from below, if at all.

As a starting point for the process in accordance with the invention, it will be observed that the interfacial layer 120 is grown on substrate or semiconductor material body or layer 110 as described above as illustrated at step 410 but the Hi-K layer is not applied. The interfacial layer suitable for successful practice of the invention can be formed by thermal oxidation, thermal nitridation or a combination of oxidation and nitridation with a thickness ranging from 0.5 nm to 1.5 nm. In FIG. 3B, the aluminum-containing stack 140 is constituted and patterned as in FIG. 1B but is formed and patterned directly on the interfacial layer 120 as illustrated at step 420 rather than on the Hi-K material. In FIG. 1C, the lanthanum oxide layer 150 is applied and covers stack 140 as before but, again, where stack 140 has been patterned directly on the interfacial layer 120 rather than on the Hi-K material, stack 140 serves as a barrier against diffusion of oxide.

The annealing process is then performed to drive in the aluminum and lanthanum fixed charge materials, as illustrated at step 430, but, in this case and in accordance with the invention, the fixed charge materials are driven into the thin interfacial layer 120 as illustrated in FIG. 3D rather than the thicker (but still very thin) Hi-K material gate insulator as in FIG. 1D. Then as shown in step 440, the materials deposited in steps 420 and 430 are preferably etched away selectively to the interfacial layer and the Hi-K material 130/180 (to connote a possibly different preferred Hi-K material) is deposited. Then as shown in FIGS. 3E and 3F, a gate metal or alloy is deposited and the transistors completed by patterning the gate stack to the substrate or layer 110 and forming sidewalls, performing implants, silicidation and the like, as desired, as before, as illustrated at steps 450 and 460.

Referring now to FIG. 3G the principal and advantageous structural difference from that provided by the process of FIGS. 1A-1F is illustrated. Again, it may be helpful to directly compare FIG. 3G with each of FIGS. 1G and 1H. As alluded to above, diffusion of fixed charge materials will be driven into the upper side of interfacial layer 120 and into the upper portion of the thickness thereof during the annealing process of step 430. It is preferred that the annealing process be limited in time and temperature such that the diffused fixed charge materials do not reach the channel region. (If fixed charge materials diffuse into the channel region of the transistor, mobility of free carriers will be undesirably reduced.) Therefore, the fixed charge materials are positioned very closely adjacent if not contiguous with the channel region for maximal effect on the work function and corresponding threshold of the HKMG transistors.

Since the annealing is performed prior to the deposition of Hi-K material, there will be little, if any diffusion into the Hi-K material even if hafnium oxide is used as the Hi-K material, as is preferred in some applications, as having greater effect on the work function, wherever located. Therefore, the lanthanum oxide diffusion is largely stabilized and of little effect on the threshold of the HKMG transistors since any diffusion or instability thereof in hafnium oxide or the like is necessarily above the greater concentration of fixed charge material near the surface of the interfacial layer 120. It should be noted, in this regard, that some trimming or repair of the voltage threshold can be obtained in accordance with the invention and, in theory, can be obtained by further heat treatment which causes out-diffusion of some fraction of the concentration of fixed charge materials back into the Hi-K material where they are of little, if any effect. This process would be expected to be of low criticality of parameters thereof. It should also be appreciated that hafnium oxide would be preferable to HfSiON in this latter regard since greater diffusion from the interfacial layer into hafnium oxide would be expected while the lower diffusivity of fixed charge materials into HfSiON may substantially preclude this possible effect. It should also be appreciated that HfSiON would be preferable to hafnium oxide in order to achieve the desired Vt but with less variability caused by excess oxygen that easily diffuses in hafnium oxide.

Conversely, it should be noted, as schematically illustrated at 55n, 55p of FIG. 5 that not only is the effect of fixed charge materials greater due to greater proximity of the fixed charge materials to the channel but the instability characteristic of prior diffusion techniques is greatly diminished, again, due to the proximity to the channel of the fixed charge materials in the extremely thin interfacial layer and the fact that diffusion into the Hi-K material is not required and can be avoided altogether unless some other beneficial effect such as trimming the threshold as described above is desired. Further, by adjusting the concentration of fixed charge materials diffused into the interfacial layer, the desired NFET and PFET thresholds can be closely approached and, in general, substantially achieved.

It should be further appreciated that the process in accordance with the invention can provide for improved effects of modification of work function and threshold using any Hi-K material since diffusion of fixed charge material into the Hi-K material is not required and, in any event, the fixed charge material is located toward the bottom of or below the Hi-K material. In other words, known techniques of work function and threshold modification have assumed that charge/dipoles were required at the metal to Hi-K material interface to achieve that function. However, the present invention exploits the discovery by the inventors of the sufficiency and greater effectiveness for work function and switching threshold adjustment of fixed charge material at, within or near the interfacial layer oxide/conduction channel interface as well as avoidance of problems associated with diffusivity of fixed charge materials within a given Hi-K material.

In view of the foregoing, it is clearly seen that the invention provides a novel HKMG transistor structure and method of its manufacture which provides for much increased latitude in engineering and substantially closer achievement of desired values of switching threshold voltages in HKMG transistors than has been available in other processes or designs prior to the present invention. The processes involved are simplified and of reduced criticality with larger process parameter tolerance windows and can, in some instances, provide additional repair, trimming or adjustment of the threshold values obtained.

While the invention has been described in terms of a single preferred embodiment, those skilled in the art will recognize that the invention can be practiced with modification within the spirit and scope of the appended claims.

Having thus described my invention, what we claim as new and desire to secure by Letters Patent is as follows:

1. A method of manufacture of a semiconductor device, said method comprising steps of
   forming an interfacial layer containing a fixed charge material on a layer or substrate of semiconductor material,
   forming a gate structure including a Hi-K dielectric and a gate electrode comprising metal or an alloy on said interfacial layer, wherein said fixed charge material is confined to said interfacial layer and said gate structure, and
   completing said semiconductor device,
   whereby a threshold of said semiconductor device due to a work function of said metal or alloy of said gate electrode is altered while avoiding said fixed charge material in said layer or substrate.

2. The method as recited in claim 1 comprising the further step of
   heat treating said semiconductor device subsequent to forming a gate dielectric of Hi-K material on said interfacial layer containing said fixed charge material to out-diffuse a portion of said fixed charge material into said Hi-K material from said interfacial layer.

3. A method of manufacture of a semiconductor device, said method comprising steps of
   forming an interfacial layer containing a fixed charge material on a layer or substrate of semiconductor material, wherein said step of forming said interfacial layer containing said fixed charge material comprises steps of forming the interfacial layer, and forming a diffusion source containing said fixed charge material on said interfacial layer, and annealing the interfacial layer to diffuse said fixed charge material into said interfacial layer,
   forming a gate structure including a Hi-K dielectric and a gate electrode comprising metal or an alloy on said interfacial layer, and
   completing said semiconductor device.

4. The method as recited in claim 3, including the further step of removing said diffusion source subsequent to said annealing step.

5. The method as recited in claim 4, comprising the further step of
   forming a gate dielectric of Hi-K material on said interfacial layer subsequent to said step of annealing.

6. The method as recited in claim 3, comprising the further step of
   forming a gate dielectric of Hi-K material on said interfacial layer subsequent to said step of annealing.

* * * * *